US009117546B2

United States Patent
Huang (10) Patent No.: US 9,117,546 B2
(45) Date of Patent: Aug. 25, 2015

(54) METHOD FOR AUTO-REFRESHING MEMORY CELLS IN SEMICONDUCTOR MEMORY DEVICE AND SEMICONDUCTOR MEMORY DEVICE USING THE METHOD

(71) Applicant: ELITE SEMICONDUCTOR MEMORY TECHNOLOGY INC., Hsinchu (TW)

(72) Inventor: Ming-Chien Huang, New Taipei (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 203 days.

(21) Appl. No.: 14/032,159

(22) Filed: Sep. 19, 2013

(65) Prior Publication Data

US 2015/0078112 A1    Mar. 19, 2015

(51) Int. Cl.
*G11C 7/00*    (2006.01)
*G11C 11/406*    (2006.01)
*G11C 8/12*    (2006.01)
*G11C 11/408*    (2006.01)

(52) U.S. Cl.
CPC ............ *G11C 11/40618* (2013.01); *G11C 8/12* (2013.01); *G11C 11/4087* (2013.01); *G11C 11/40611* (2013.01)

(58) Field of Classification Search
CPC ............... G11C 11/40618; G11C 8/12; G11C 11/40611; G11C 11/4087
USPC ........... 365/222, 189.07, 149, 189.11, 230.03
See application file for complete search history.

(56) References Cited

U.S. PATENT DOCUMENTS

| 7,701,796 | B2 * | 4/2010 | Kim .............................. 365/222 |
| 2008/0298153 | A1 * | 12/2008 | Mae .............................. 365/222 |
| 2010/0110817 | A1 * | 5/2010 | Noda et al. ..................... 365/222 |
| 2013/0188429 | A1 * | 7/2013 | Huang ..................... 365/189.07 |
| 2013/0336079 | A1 * | 12/2013 | Kim et al. ..................... 365/222 |

* cited by examiner

*Primary Examiner* — Toan Le
(74) *Attorney, Agent, or Firm* — Li & Cai Intellectual Property (USA) Office (57) ABSTRACT

An exemplary embodiment of the present disclosure illustrates a method for auto-refreshing memory cells in a semiconductor memory device with an open bit line architecture, wherein the semiconductor memory device comprises M memory banks, and each of the M memory banks has two particular sectors with a same index and L remained sectors with different indices. Two word lines of the two particular sectors with the same index in the memory bank and (M−1) word lines of the L remained sectors respectively in the other (M−1) memory banks are selected in one cycle. Then, memory cells of the selected word lines are refreshed.

12 Claims, 7 Drawing Sheets

|  | BANK_A | BANK_B | BANK_C | BANK_D |
|---|---|---|---|---|
| sequence[cycle$_0$] → | SEC[0] | SEC[1] | SEC[2] | SEC[3] |
| sequence[cycle$_1$] → | SEC[3] | SEC[0] | SEC[1] | SEC[2] |
| sequence[cycle$_2$] → | SEC[2] | SEC[3] | SEC[0] | SEC[1] |
| sequence[cycle$_3$] → | SEC[1] | SEC[2] | SEC[3] | SEC[0] |

| | BANK_A | BANK_B | BANK_C | BANK_D |
|---|---|---|---|---|
| sequence[cycle$_0$] → | SEC[0] | SEC[3] | SEC[3] | SEC[3] |
| sequence[cycle$_1$] → | SEC[2] | SEC[0] | SEC[2] | SEC[2] |
| sequence[cycle$_2$] → | SEC[1] | SEC[1] | SEC[0] | SEC[1] |
| sequence[cycle$_3$] → | SEC[3] | SEC[2] | SEC[1] | SEC[0] |

| BANK_A | BANK_B | BANK_C | BANK_D |
|--------|--------|--------|--------|
| SEC[0] | SEC[3] | SEC[2] | SEC[2] |
| SEC[1] | SEC[0] | SEC[1] | SEC[3] |
| SEC[2] | SEC[2] | SEC[0] | SEC[1] |
| SEC[3] | SEC[1] | SEC[3] | SEC[0] |

↑ sequence[cycle$_0$]
↑ sequence[cycle$_1$]
↑ sequence[cycle$_2$]
↑ sequence[cycle$_3$]

FIG.4C

METHOD FOR AUTO-REFRESHING MEMORY CELLS IN SEMICONDUCTOR MEMORY DEVICE AND SEMICONDUCTOR MEMORY DEVICE USING THE METHOD

BACKGROUND

1. Technical Field

The present disclosure is related to a semiconductor memory device, and in particular to, a method for auto-refreshing memory cells in a semiconductor memory device and the semiconductor memory device using the method, wherein the semiconductor memory device has an open bit line architecture.

2. Description of Related Art

Currently, the semiconductor memory device technology develops fast, and the semiconductor memory devices with large capacities are usually used in our daily life. Some semiconductor memory device, such as dynamic random access memory (DRAM), needs to refresh the memory cells thereof, since the charges stored in the memory cells may run off due to the leakage path or reading operation of the semiconductor memory device.

Figure 1A:
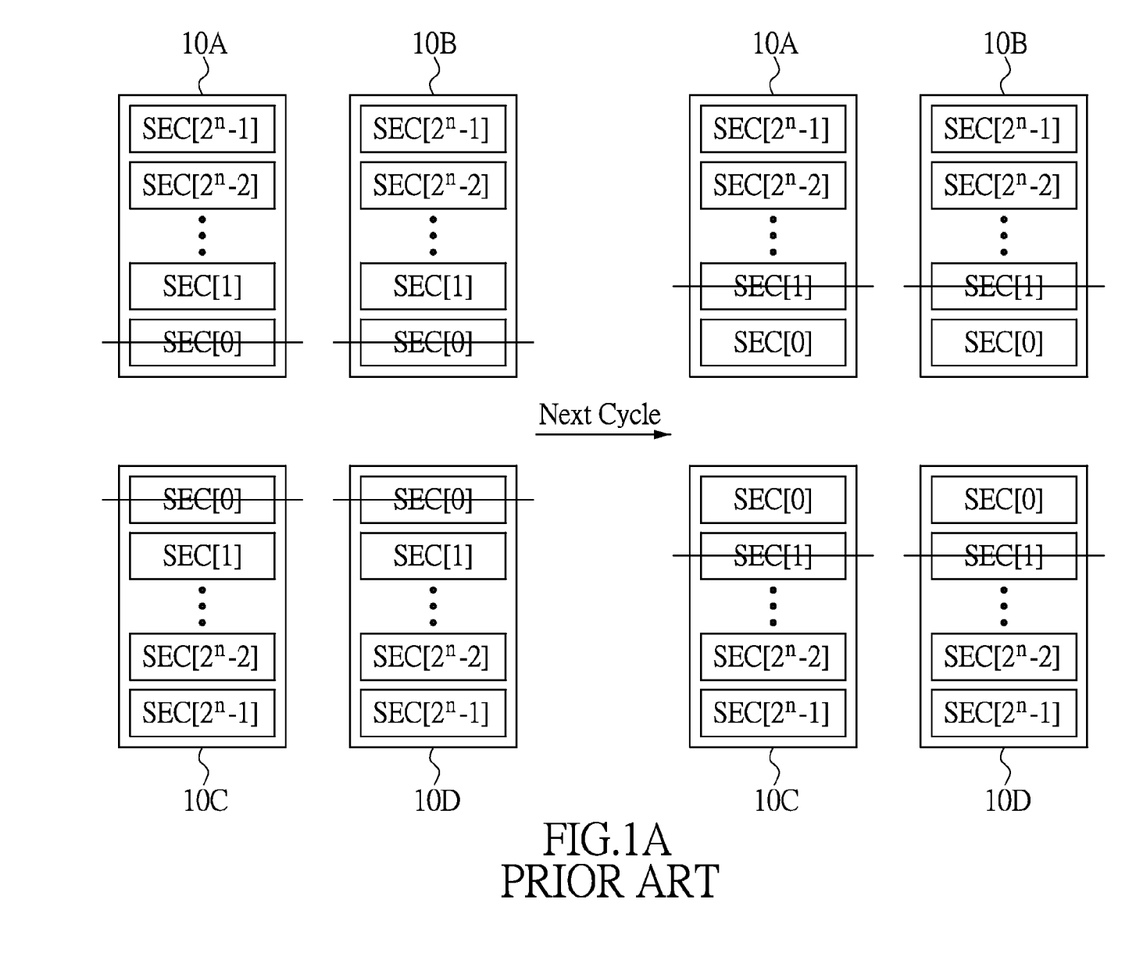
FIG. 1A is a schematic diagram showing a conventional method for auto-refreshing the memory cells in a semiconductor memory device with a folded bit line architecture.

Referring to FIG. 1A, FIG. 1A is a schematic diagram showing a conventional method for auto-refreshing the memory cells in a semiconductor memory device with a folded bit line architecture. The semiconductor memory device with the folded bit line architecture comprises several memory banks 10A through 10D, and each of the memory banks 10A through 10D has several sectors SEC[0] through SEC[$2^n-1$] with different indices, wherein n is a positive integer larger than 1.

In FIG. 1A, the word lines in the sectors SEC[0] of the memory banks 10A through 10D are selected in the current cycle, and the memory cells of the four selected word lines are refreshed. In the next cycle, the word lines in the sectors SEC[1] of the memory banks 10A through 10D are selected, and the memory cells of the four selected word lines are refreshed. It is thus known that the memory cells in the four word lines are refreshed in each one cycle.

Figure 1B:
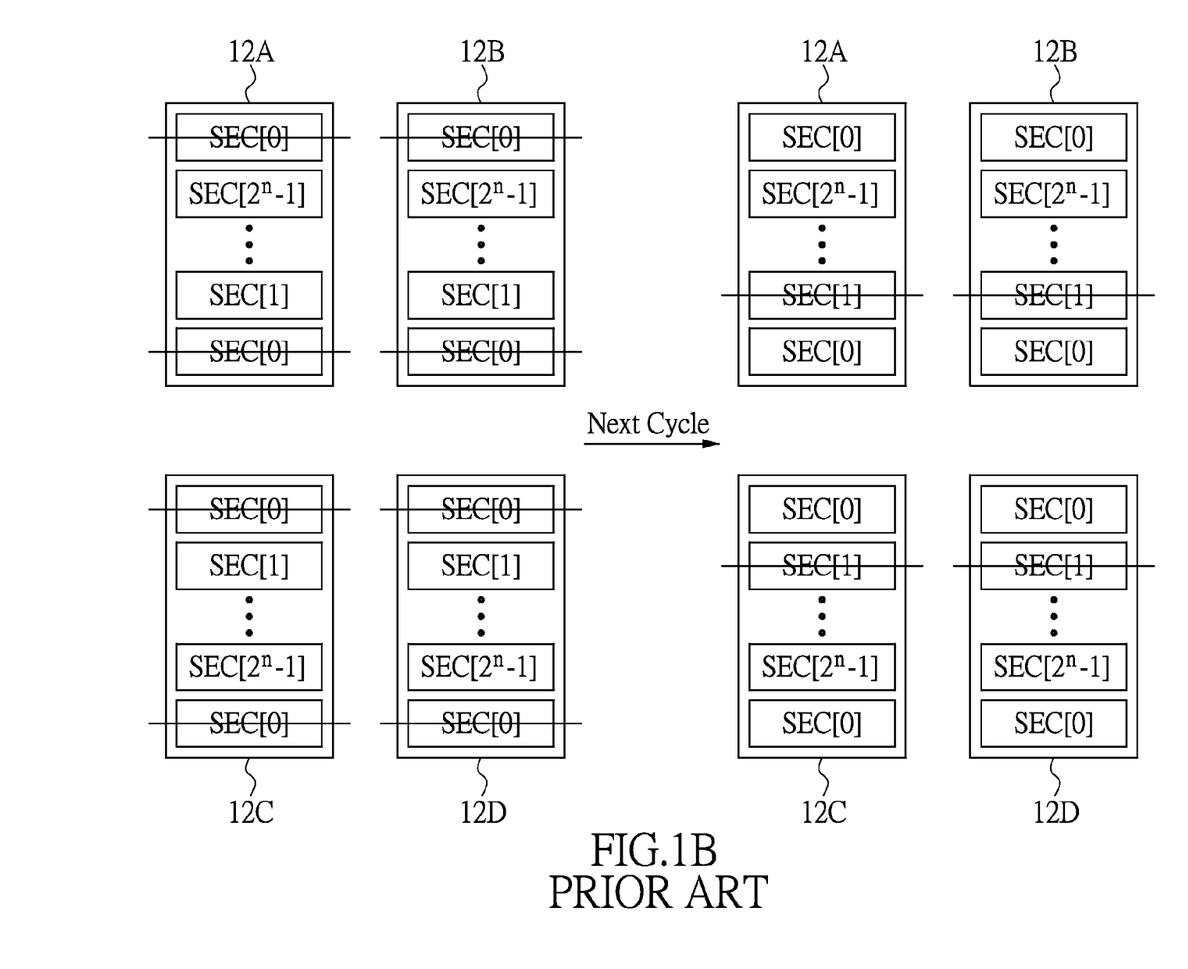
FIG. 1B is a schematic diagram showing a conventional method for auto-refreshing the memory cells in a semiconductor memory device with an open bit line architecture.

Referring to FIG. 1B, FIG. 1B is a schematic diagram showing a conventional method for auto-refreshing the memory cells in a semiconductor memory device with an open bit line architecture. The semiconductor memory device with the open bit line architecture comprises several memory banks 12A through 12D, and each of the memory banks 12A through 12D has two particular sectors SEC[0] with the same index and remained sectors SEC[1] through SEC[$2^n-1$] with different indices, wherein n is a positive integer larger than 1.

In FIG. 1B, the word lines in the particular sectors SEC[0] with the same index of the memory banks 12A through 12D are selected in the current cycle, and the memory cells of the eight selected word lines are refreshed. In the next cycle, the word lines in the remained sectors SEC[1] of the memory banks 12A through 12D are selected, and the memory cells of the four selected word lines are refreshed. It is thus known that the memory cells in the eight word lines are refreshed merely in specific one cycle, and the memory cells in the four word lines are refreshed in the other cycles.

It is noted that the refreshing voltage and the chip area is related to the number of the selected word lines in the cycle. Since the semiconductor memory device with the open bit line architecture selects eight word lines in specific one of several cycles, the refreshing voltage generated by the charge pump in the semiconductor memory device with the open bit line architecture would be higher than that generated in the semiconductor memory device with the folded bit line architecture, and the chip area of the semiconductor memory device with the open bit line architecture is larger than that of the semiconductor memory device with the folded bit line architecture (p.s. the higher the voltage the charge pump generates, the larger the chip area of the charge pump is; and the more the word lines are selected in the specific one cycle, the larger the chip area of the memory bank is). Thus, the semiconductor memory device with the open bit line architecture has more cost due to the charge pump with the higher generated voltage and the larger chip area.

SUMMARY

An exemplary embodiment of the present disclosure illustrates a method for auto-refreshing memory cells in a semiconductor memory device with an open bit line architecture, wherein the semiconductor memory device comprises M memory banks, and each of the M memory banks has two particular sectors with a same index and L remained sectors with different indices. Two word lines of the two particular sectors with the same index in the memory bank and (M−1) word lines of the L remained sectors respectively in the other (M−1) memory banks are selected in one cycle. Then, memory cells of the selected word lines are refreshed.

In one preferred exemplary embodiment of the present disclosure,

An exemplary embodiment of the present disclosure illustrates semiconductor memory device with an open bit line architecture. The semiconductor memory device comprises M memory banks, a memory management controller, and a charge pump. Each of the M memory banks has two particular sectors with a same index and L remained sectors with different indices. The memory management controller selects two word lines of the two particular sectors with the same index in the memory bank and (M−1) word lines of the L remained sectors respectively in the other (M−1) memory banks in one cycle. The charge pump generates a refreshing voltage to refresh memory cells of the selected word lines.

To sum up, the method for auto-refreshing memory cells in the semiconductor memory device with the open bit line architecture can decrease the chip area and cost of the semiconductor memory device and the refreshing voltage generated by the charge pump.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or similar parts.

Figure 2:
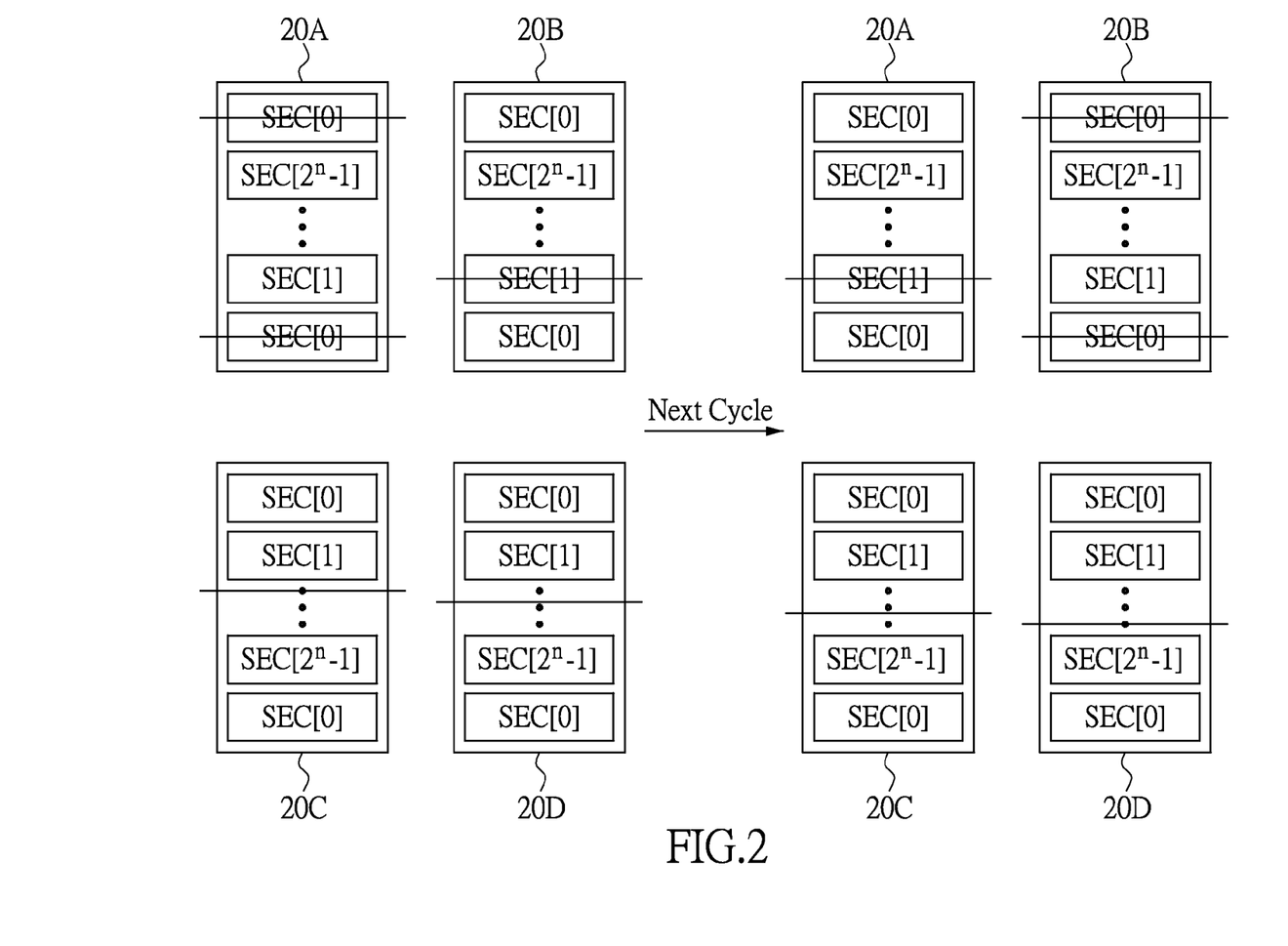
FIG. 2 is a schematic diagram showing a method for auto-refreshing memory cells in a semiconductor memory device with an open bit line architecture according to an exemplary embodiment of the present disclosure.

Exemplary Embodiment of Method for Auto-Refreshing Memory Cells in Semiconductor Memory Device Referring to FIG. 2, FIG. 2 is a schematic diagram showing a method for auto-refreshing memory cells in a semiconductor memory device with an open bit line architecture according to an exemplary embodiment of the present disclosure. The semiconductor memory device is for example a DRAM, but the present disclosure is not limited thereto, that is, the method provided in the present disclosure can be used in any one semiconductor memory device with the open bit line architecture having memory cells which should be refreshed periodically or at some specific time.

The semiconductor memory devices comprises a plurality of memory banks 20A through 20D, each of the memory banks 20A through 20D has two particular sectors SEC[0] with the same index and remained sectors SEC[1] through SEC[$2^n$-1] with different indices, wherein n is a positive integer larger than 1.

In the current cycle, the word line in the two particular sectors SEC[0] with the same index of the memory bank 20A and the word lines in the remained sectors SEC[1] through SEC [3] with different indices respectively in the memory banks 20B through 20D are selected in the current cycle, and the memory cells of the five selected word lines are refreshed. In the next cycle, the word line in the two particular sectors SEC[0] with the same index of the memory bank 20B and the word lines in the remained sectors SEC[1] through SEC [3] with different indices respectively in the memory banks 20A, 20C through 20D are selected, and the memory cells of the five selected word lines are refreshed. It is thus known that the memory cells in the five word lines are refreshed in each cycle. However, the present disclosure is not limited thereto. In another implementation, merely the two word lines in the two particular sectors SEC[0] with same index of one of the memory banks 20A through 20D are selected in each cycle, or alternatively, no word lines in the particular sectors with the same index of the memory banks 20A through 20D are selected.

In the case that n is equal to 2 and the number of the memory banks is equal to 4, the word lines of the particular sectors SEC[0] with the same index respectively in the memory banks 20A through 20D are sequentially selected in the four cycles. That is, in each cycle, merely five word lines are selected, wherein two selected word lines respectively belong to two particular sectors SEC[0] with the same index of one memory bank (for example, the memory bank 20A), and three selected word lines respectively belong to the three remained sectors SEC[1] through SEC[3] respectively in the other three memory banks (for example, the memory banks 20B through 20D). It is noted that selected remained sectors in the other three memory banks may have the different indices or the same index, and the present disclosure is not limited thereto.

Furthermore, the present disclosure does not limit the number of the memory banks and the number of the sectors in the memory banks. Herein, a general case is summarized. The semiconductor memory device with the open bit line architecture has M memory banks, and each of the M memory banks has two particular sectors with the same index and L remained sectors with different indices. In one of cycles, according to a given sequence, the word lines of the remained sectors respectively in the M memory banks are selected, or alternatively, the word lines of the particular sectors with the same index in one memory bank and the word lines of the remained sectors respectively in the other memory banks are selected, and the memory cells of the M or (M+1) selected word lines are refreshed.

Since no more than (M+1) word lines are selected in each cycle, the refreshing voltage generated by the charge pump in the semiconductor memory device with the open bit line architecture would be decreased, and the chip area of the semiconductor memory device with the open bit line architecture would be decreased, too.

Figure 3:
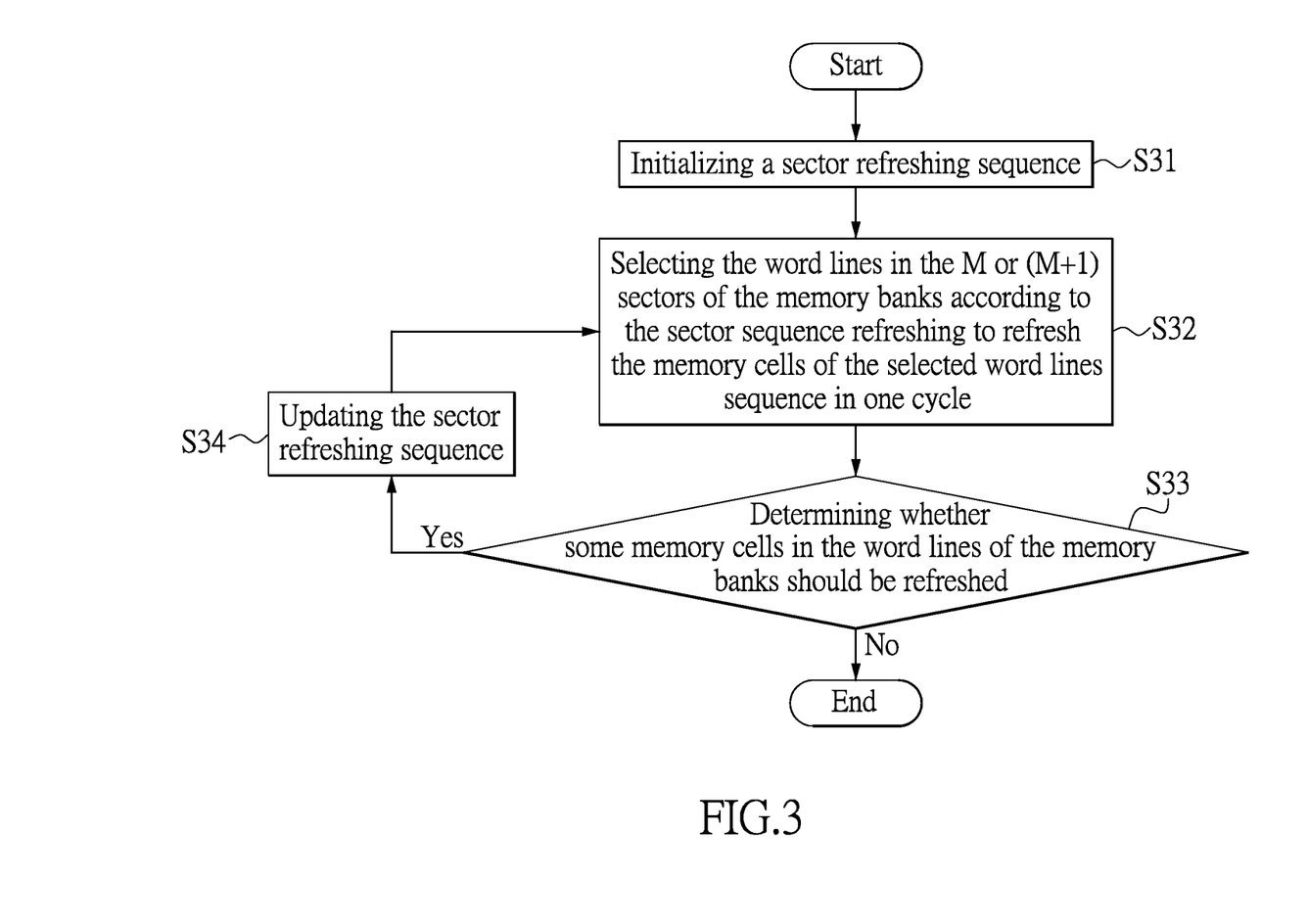
FIG. 3 is a flow chart showing a method for auto-refreshing memory cells in a semiconductor memory device with an open bit line architecture according to an exemplary embodiment of the present disclosure.

Based upon the above description, the flow of the method for auto-refreshing memory cells in the semiconductor memory device with the open bit line architecture is illustrated and depicted as follows. Referring to FIG. 3, FIG. 3 is a flow chart showing a method for auto-refreshing memory cells in a semiconductor memory device with an open bit line architecture according to an exemplary embodiment of the present disclosure. The semiconductor memory device with the open bit line architecture has M memory banks, and each of the M memory banks has two particular sectors with the same index and L remained sectors with different indices.

At step S31, a sector refreshing sequence is initialized by a memory management controller of the semiconductor memory device. Then, at step S32, the memory management controller of the semiconductor memory device selects the word lines in the M or (M+1) sectors of the memory banks according to the sector refreshing sequence in one cycle to refresh the memory cells of the selected word lines, wherein the sector refreshing sequence is used to indicate the memory management controller to select the two word lines of the two particular sectors with the same index of one memory bank and the (M−1) word lines of the remained sectors respectively in the other (M−1) memory banks in one cycle, or to select the M word lines of the remained sectors respectively in the other M memory banks in one cycle.

Next, at step S33, the memory management controller of the semiconductor memory device determines whether some memory cells in the word lines of the memory banks should be refreshed. If some memory cells in the word lines of the memory banks should be refreshed, step S34 will be executed. If no memory cells in the word lines of the memory banks should be refreshed, the method for auto-refreshing memory cells in the semiconductor memory device with the open bit line architecture will be terminated. At step S34, the memory management controller of the semiconductor memory device update the sector refreshing sequence, and then step S32 is executed again after step S34 has been executed.

Next, several examples that the semiconductor memory device has four memory banks and each memory bank has two particular sectors with the same index and three remained sectors with the different indices are illustrated accompanied with the different cases of sector refreshing sequences.

Figure 4A:
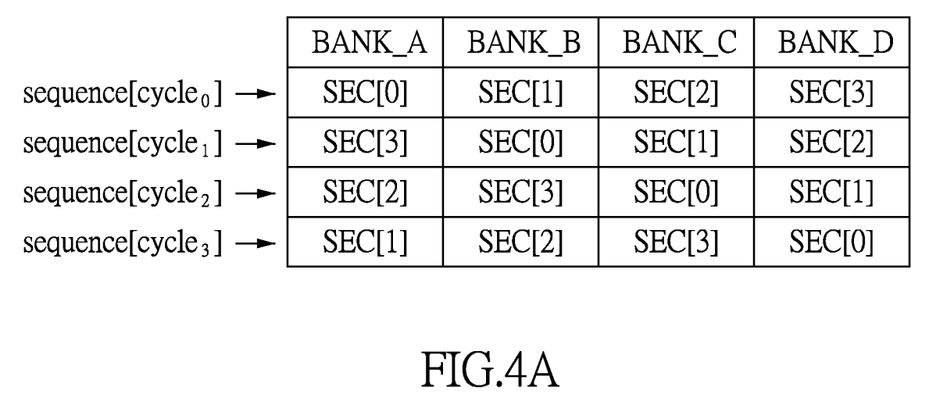
FIG. 4A is a table showing the sector refreshing sequence in the different cycles according to an exemplary embodiment of the present disclosure.

Referring to FIG. 4A, FIG. 4A is a table showing the sector refreshing sequence in the different cycles according to an exemplary embodiment of the present disclosure. The sector refreshing sequence sequence[$cycle_0$] in the first cycle $cycle_0$ is used to indicate the memory management controller of the semiconductor memory device to select the two word lines of the two particular sectors SEC[0] in the memory bank BANK_A and the three word lines of the three remained sectors SEC[1] through SEC[3] respectively in the memory banks BANK_B, BANK_C, BANK_D to refresh the memory cells of the selected word lines.

The sector refreshing sequence sequence[$cycle_1$] in the second cycle $cycle_1$ is used to indicate the memory management controller of the semiconductor memory device to select the two word lines of the two particular sectors SEC[0] in the memory bank BANK_B and the three word lines of the three remained sectors SEC[1] through SEC[3] respectively in the memory banks BANK_C, BANL_D, BANK_A to refresh the memory cells of the selected word lines.

The sector refreshing sequence sequence[$cycle_2$] in the third cycle $cycle_2$ is used to indicate the memory management controller of the semiconductor memory device to select the two word lines of the two particular sectors SEC[0] in the memory bank BANK_C and the three word lines of the three remained sectors SEC[1] through SEC[3] respectively in the memory banks BANK_D, BANL_A, BANK_B to refresh the memory cells of the selected word lines.

The sector refreshing sequence sequence[$cycle_3$] in the fourth cycle $cycle_3$ is used to indicate the memory management controller of the semiconductor memory device to select the two word lines of the two particular sectors SEC[0] in the memory bank BANK_D and the three word lines of the three remained sectors SEC[1] through SEC[3] respectively in the memory banks BANK_A, BANL_B, BANK_C to refresh the memory cells of the selected word lines.

Figure 4B:
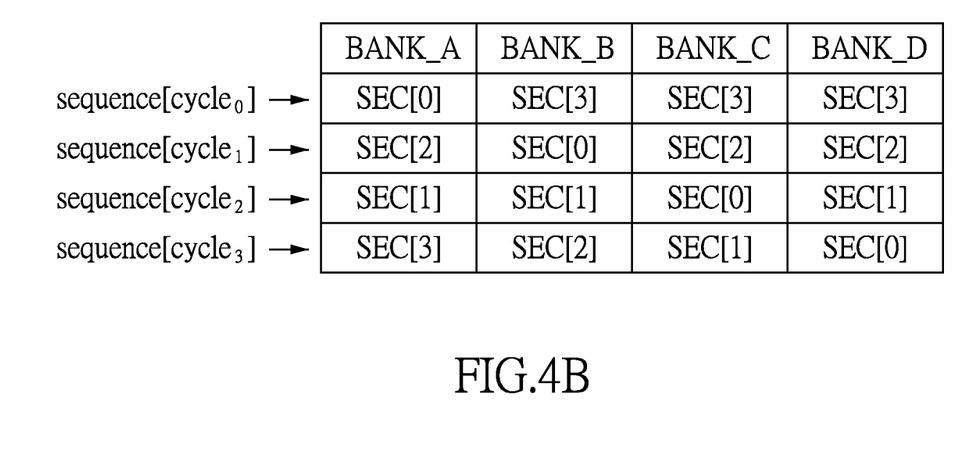
FIG. 4B is a table showing the sector refreshing sequence in the different cycles according to another exemplary embodiment of the present disclosure.

Referring to FIG. 4B, FIG. 4B is a table showing the sector refreshing sequence in the different cycles according to another exemplary embodiment of the present disclosure. The sector refreshing sequence sequence[$cycle_0$] in the first cycle $cycle_0$ is used to indicate the memory management controller of the semiconductor memory device to select the two word lines of the two particular sectors SEC[0] in the memory bank BANK_A and the three word lines of the three remained sectors SEC[3] respectively in the memory banks BANK_B, BANK_C, BANK_D to refresh the memory cells of the selected word lines.

The sector refreshing sequence sequence[$cycle_1$] in the second cycle $cycle_1$ is used to indicate the memory management controller of the semiconductor memory device to select the two word lines of the two particular sectors SEC[0] in the memory bank BANK_B and the three word lines of the three remained sectors SEC[2] respectively in the memory banks BANK_C, BANL_D, BANK_A to refresh the memory cells of the selected word lines.

The sector refreshing sequence sequence[$cycle_2$] in the third cycle $cycle_2$ is used to indicate the memory management controller of the semiconductor memory device to select the two word lines of the two particular sectors SEC[0] in the memory bank BANK_C and the three word lines of the three remained sectors SEC[1] respectively in the memory banks BANK_D, BANL_A, BANK_B to refresh the memory cells of the selected word lines.

The sector refreshing sequence sequence[$cycle_3$] in the fourth cycle $cycle_3$ is used to indicate the memory management controller of the semiconductor memory device to select the two word lines of the two particular sectors SEC[0] in the memory bank BANK_D and the three word lines of the three remained sectors SEC[1] through SEC[3] respectively in the memory banks BANK_C, BANL_B, BANK_A to refresh the memory cells of the selected word lines.

Figure 4C:
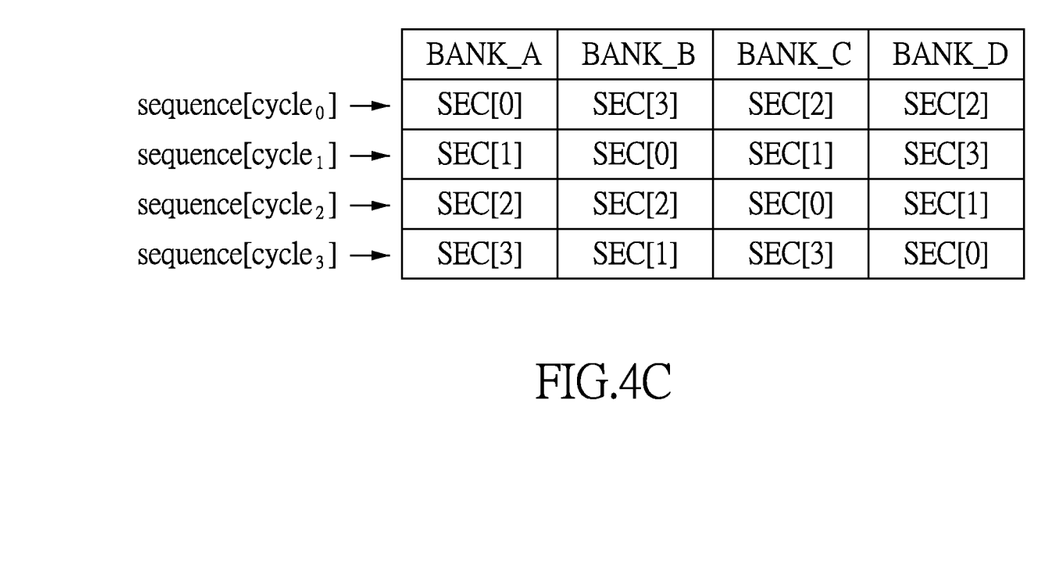
FIG. 4C is a table showing the sector refreshing sequence in the different cycles according to another exemplary embodiment of the present disclosure.

Referring to FIG. 4C, FIG. 4C is a table showing the sector refreshing sequence in the different cycles according to an exemplary embodiment of the present disclosure. The sector refreshing sequence sequence[$cycle_0$] in the first cycle $cycle_0$ is used to indicate the memory management controller of the semiconductor memory device to select the two word lines of the two particular sectors SEC[0] in the memory bank BANK_A, the two word lines of the two remained sectors SEC[2] respectively in the memory banks BANK_C, BANK_D, and the word line of the remained sector SEC[3] in the memory bank BANK_B, to refresh the memory cells of the selected word lines.

The sector refreshing sequence sequence[$cycle_1$] in the second cycle $cycle_1$ is used to indicate the memory management controller of the semiconductor memory device to select the two word lines of the two particular sectors SEC[0] in the memory bank BANK_B, the two word lines of the two remained sectors SEC[1] respectively in the memory banks BANK_A, BANK_C, and the word line of the remained sector SEC[3] in the memory bank BANK_D, to refresh the memory cells of the selected word lines.

The sector refreshing sequence sequence[$cycle_2$] in the third cycle $cycle_2$ is used to indicate the memory management controller of the semiconductor memory device to select the two word lines of the two particular sectors SEC[0] in the memory bank BANK_C, the two word lines of the two remained sectors SEC[2] respectively in the memory banks BANK_B, BANK_A, and the word line of the remained sector SEC[1] in the memory bank BANK_D, to refresh the memory cells of the selected word lines.

The sector refreshing sequence sequence[$cycle_2$] in the fourth cycle $cycle_3$ is used to indicate the memory management controller of the semiconductor memory device to select the two word lines of the two particular sectors SEC[0] in the memory bank BANK_D, the two word lines of the two remained sectors SEC[3] respectively in the memory banks BANK_A, BANK_C, and the word line of the remained sector SEC[1] in the memory bank BANK_B, to refresh the memory cells of the selected word lines.

From the above examples, it is known that the two word lines of the two particular sectors with the same index in one of at least four memory banks and the at least three word lines of the remained sectors in the at least other three memory banks are selected to refresh the memory cells of the selected word lines in one cycle. However, as mentioned above, the present disclosure is not limited thereto. In another implementation, merely in some cycle, the two word lines of the two particular sectors with the same index in the memory bank are selected, otherwise, no word lines of the two particular sectors with the same index in anyone of the memory banks are selected.

Exemplary Embodiment of Semiconductor Memory Device

An exemplary embodiment of the present disclosure further provides a semiconductor memory device with an open bit line architecture. The semiconductor memory device comprises a charge pump, a memory management controller, and at least four memory banks. Each of the memory banks has two particular sectors with the same index and at least three remained sectors with different indices.

The above method can be executed in the semiconductor device. In each cycle, the memory management controller selects the two word lines of the particular sectors with the same index in one memory bank and the word lines of the remained sectors respectively in the other memory banks to refresh the memory cells of the selected word lines, or alternatively selects the word lines of the remained sectors respectively in the memory banks to refresh the memory cells of the selected word lines.

Possible Result of Exemplary Embodiment

Accordingly, the method for auto-refreshing memory cells in the semiconductor memory device with the open bit line architecture can decrease the chip area and cost of the semiconductor memory device and the refreshing voltage generated by the charge pump.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A method for auto-refreshing memory cells in a semiconductor memory device with an open bit line architecture, wherein the semiconductor memory device comprises M memory banks, and each of the M memory banks has two particular sectors with a same index and L remained sectors with different indices, and the method comprises:
    selecting two word lines of the two particular sectors with the same index in the memory bank and (M−1) word lines of the L remained sectors respectively in the other (M−1) memory banks in one cycle; and
    refreshing the memory cells of the selected word lines.

2. The method according to claim 1, wherein M is equal to 4 and L is equal to 3.

3. The method according to claim 1, wherein the two word lines of the two particular sectors with the same index in the memory bank and (M−1) word lines of the L remained sectors respectively in the other (M−1) memory banks are selected each cycle.

4. The method according to claim 1, further comprising:
    selecting the word lines of the L remained sectors of the M memory banks in another cycle.

5. The method according to claim 4, wherein according to a sector refreshing sequence, the two word lines of the two particular sectors with the same index in the memory bank and (M−1) word lines of the L remained sectors respectively in the other (M−1) memory banks are selected, or the word lines of the L remained sectors of the M memory banks are selected.

6. The method according to claim 1, wherein the semiconductor memory device is a dynamic random access memory.

7. A semiconductor memory device with an open bit line architecture, comprising:
    M memory banks, each of the M memory banks has two particular sectors with a same index and L remained sectors with different indices;
    a memory management controller, for selecting two word lines of the two particular sectors with the same index in the memory bank and (M−1) word lines of the L remained sectors respectively in the other (M−1) memory banks in one cycle; and
    a charge pump, for generating a refreshing voltage to refresh memory cells of the selected word lines.

8. The semiconductor memory device according to claim 7, wherein M is equal to 4 and L is equal to 3.

9. The semiconductor memory device according to claim 7, wherein the memory management controller selects two word lines of the two particular sectors with the same index in the memory bank and (M−1) word lines of the L remained sectors respectively in the other (M−1) memory banks each cycle.

10. The semiconductor memory device according to claim 7, wherein the memory management controller selects the word lines of the L remained sectors of the M memory banks in another cycle.

11. The semiconductor memory device according to claim 10, wherein according to a sector refreshing sequence, the two word lines of the two particular sectors with the same index in the memory bank and (M−1) word lines of the L remained sectors respectively in the other (M−1) memory banks are selected, or the word lines of the L remained sectors of the M memory banks are selected by the memory management controller.

12. The semiconductor memory device according to claim 7, wherein the semiconductor memory device is a dynamic random access memory.

* * * * *